(12) United States Patent
Li et al.

(10) Patent No.: US 8,941,460 B2
(45) Date of Patent: Jan. 27, 2015

(54) ROLLED-UP TRANSFORMER STRUCTURE FOR A RADIOFREQUENCY INTEGRATED CIRCUIT (RFIC)

(71) Applicant: The Board of Trustees of the University of Illinois, Urbana, IL (US)

(72) Inventors: Xiuling Li, Champaign, IL (US); Wen Huang, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/051,208

(22) Filed: Oct. 10, 2013

(65) Prior Publication Data
US 2014/0104030 A1 Apr. 17, 2014

Related U.S. Application Data

(60) Provisional application No. 61/888,833, filed on Oct. 9, 2013, provisional application No. 61/818,689, filed on May 2, 2013, provisional application No. 61/712,360, filed on Oct. 11, 2012.

(51) Int. Cl.
*H01F 27/28* (2006.01)
*H01F 5/00* (2006.01)
(Continued)

(52) U.S. Cl.
CPC ...... *H01L 23/66* (2013.01); *H01F 5/02* (2013.01); *H01F 41/02* (2013.01); *H01L 28/10* (2013.01); *H01F 27/2847* (2013.01);
(Continued)

(58) Field of Classification Search
USPC ............. 336/220, 182, 223, 200, 232
See application file for complete search history.

(56) References Cited

U.S. PATENT DOCUMENTS 6,067,183 A * 5/2000 Furlani et al. .............. 359/254
6,245,444 B1 * 6/2001 Marcus et al. ............. 428/616
(Continued)

FOREIGN PATENT DOCUMENTS

EP 2 423 162 A1 2/2012

OTHER PUBLICATIONS

Ali, M.S. Mohamed et al., "Out-of-plane spiral-coil inductor self-assembled by locally controlled bimorph actuation," *Micro & Nano Letters*, 6, 12 (2011) pp. 1016-1018.
(Continued)

Primary Examiner — Mangtin Lian
(74) Attorney, Agent, or Firm — Brinks Gilson & Lione

(57) ABSTRACT

A rolled-up transformer structure comprises a multilayer sheet having a rolled configuration comprising multiple turns about a longitudinal axis. The multilayer sheet comprises more than one conductive pattern layer on a strain-relieved layer, including a first conductive film and a second conductive film separated from the first conductive film in a thickness direction. The first conductive film comprises an even number of primary conductive strips, where each primary conductive strip has a length extending in the rolling direction, and the second conductive film comprises an even number of secondary conductive strips, where each secondary conductive strip has a length extending in the rolling direction. In the rolled configuration, turns of the primary conductive strips and turns of the secondary conductive strips wrap around the longitudinal axis. The primary conductive strips serve as a primary winding and the secondary conductive strips serve as a secondary winding of the rolled-up transformer structure.

7 Claims, 11 Drawing Sheets

(51) Int. Cl.
H01L 23/66 (2006.01)
H01F 5/02 (2006.01)
H01F 41/02 (2006.01)
H01L 49/02 (2006.01)
H01F 41/06 (2006.01)
H01L 23/64 (2006.01)
H01L 21/48 (2006.01)

(52) U.S. Cl.
CPC ......... *H01F 41/0604* (2013.01); *H01L 23/645* (2013.01); *H01L 21/4814* (2013.01); *H01L 2924/0002* (2013.01); *H01L 2223/6627* (2013.01)
USPC .......................... 336/220; 336/223; 336/200

(56) References Cited

U.S. PATENT DOCUMENTS

| | | | |
|---|---|---|---|
| 6,396,620 B1* | 5/2002 | Goodwin-Johansson | .... 359/292 |
| 6,879,084 B2* | 4/2005 | Pizzi | .............. 310/309 |
| 7,000,315 B2* | 2/2006 | Chua et al. | ........... 29/874 |
| 7,707,714 B2 | 5/2010 | Schmidt et al. | |
| 7,710,232 B1* | 5/2010 | Stalford et al. | .............. 336/192 |
| 7,876,190 B2* | 1/2011 | Yamamoto | .............. 336/200 |
| 8,576,469 B2* | 11/2013 | Kim et al. | .............. 359/230 |

OTHER PUBLICATIONS

Arora, William J. et al., "Membrane folding to achieve three-dimensional nanostructures: Nanopatterned silicon nitride folded with stressed chromium hinges," *Applied Physics Letters*, 88, 053108 (2006) pp. 053108-1-053108-3.
Bianucci, P. et al., "Self-Organized 1.55 µm InAs/InP Quantum Dot Tube Nanoscale Coherent Light Sources," *Winter Topicals (WTM) IEEE*, Conference Publication (2011), pp. 127-128.
Bof Bufon, Carlos César et al., "Self-Assembled Ultra-Compact Energy Storage Elements Based on Hybrid Nanomembranes," *Nano Letters*, 10 (2010) pp. 2506-2510.
Bogush, V. et al., "Electroless deposition of novel Ag—W thin films," *Microelectronic Engineering*, 70 (2003) pp. 489-494.
Chen, Daru et al., "A novel low-loss Terahertz waveguide: Polymer tube," *Optics Express*, 18, 4 (2010) pp. 3762-3767.
Chun, Ik Su et al., "Controlled Assembly and Dispersion of Strain-Induced InGaAs/GaAs Nanotubes," *IEEE Transactions on Nanotechnology*, 7, 4 (2008) pp. 493-495.
Chun, I.S. et al., "InGaAs/GaAs 3D architecture formation by strain-induced self-rolling with lithographically defined rectangular stripe arrays," *Journal of Crystal Growth*, 310 (2008) pp. 2353-2358.
Chun, Ik Su et al., "Geometry Effect on the Strain-Induced Self-Rolling of Semiconductor Membranes," *Nano Letters*, 10 (2010) pp. 3927-3932.
Dai, Lu et al., "Directional scrolling of SiGe/Si/Cr nanoribbon on Si(111) surfaces controlled by two-fold rotational symmetry underetching," *Nanoscale*, 5 (2013) pp. 971-976.
Dai, L. et al., "Strain-driven self-rolling mechanism for anomalous coiling of multilayer nanohelices," *Journal of Applied Physics*, 106, 114314 (2009) pp. 114314-1-114314-5.
Doerner, M. et al., "Stresses and Deformation Processes in Thin Films on Substrates," *CRC Critical Reviews in a Solid State and Materials Sciences*, 14, 3 (1988) pp. 224-268.
Du, Frank et al., "Aligned arrays of single walled carbon nanotubes for transparent electronics," *Proceedings of SPIE*, 8725 (2013) pp. 87251S-1-87251S-7.
Frankel, Michael Y., "Terahertz Attenuation and Dispersion Characteristics of Coplanar Transmission Lines," *IEEE Transactions on Microwave Theory and Techniques*, 39, 6 (1991), pp. 910-916.
Golod, S. V. et al., "Fabrication of conducting GeSi/Si micro- and nanotubes and helical microcoils," *Semiconductor Science and Technology*, 16 (2001) pp. 181-185.
Golod, S.V. et al., "Freestanding SiGe/Si/Cr and SiGe/Si/Si$_x$N$_y$/Cr Microtubes," *Applied Physics Letters*, 84, 17 (2004) pp. 3390-3393.

Gorin, A. et al., "Fabrication of silicon nitride waveguides for visible-light using PECVD: a study of the effect of plasma frequency on optical properties," *Optics Express*, 16, 18 (2008) pp. 13509-13516.
Harazim, Stefan M. et al., "Fabrication and applications of large arrays of multifunctional rolled-up SiO/SiO$_2$ microtubes," *Journal of Materials Chemistry*, 22, 7 (2012) pp. 2878-2884.
Heiliger, H.-M. et al., "Low-dispersion thin-film microstrip lines with cyclotene (benzocyclobutene) as dielectric medium," *Applied Physics Letters*, 70, 17 (1997) pp. 2233-2235.
Huang, G. S. et al., "Optical properties of rolled-up tubular microcavities from shaped nanomembranes," *Applied Physics Letters*, 94, 141901 (2009) 141901-1-141901-3.
Huang, Minghuang et al., "Nanomechanical Architecture of Strained Bilayer Thin Films: From Design Principles to Experimental Fabrication," *Advanced Materials*, 17 (2005) pp. 2860-2864.
Huang, Gaoshan et al., "Thinning and Shaping Solid Films into Functional and Integrative Nanomembranes," *Advanced Materials*, 24 (2012) pp. 2517-2546.
Huang, Gaoshan et al., "Rolled-up transparent microtubes as two-dimensionally confined culture scaffolds of individual yeast cells," *Lab Chip*, 9 (2009) pp. 263-268.
Huang, Minghuang et al., "Mechano-electronic Superlattices in Silicon Nanoribbons," *ACS Nano*, 3, 3 (2009) pp. 721-727.
Inberg, A. et al., "Novel Highly Conductive Silver—Tungsten Thin Films Electroless Deposited from Benzoate Solution for Microelectronic Applications," *Journal of the Electrochemical Society*, 150, 5 (2003) pp. C285-C291.
Ishigaki, Tsukasa et al., "Photonic-Crystal Slab for Terahertz-Wave Integrated Circuits," *Photonics Conference (IPC) IEEE*, Conference Publication (2012) pp. 774-775.
Jan, C.-H. et al., "A 32nm SoC Platform Technology with 2$^{nd}$ Generation High-k/Metal Gate Transistors Optimized for Ultra Low Power, High Performance, and High Density Product Applications," *IEEE*, (2009) pp. 647-650.
Jiang, Hongrui et al., "On-Chip Spiral Inductors Suspended over Deep Copper-Lined Cavities," *IEEE Transactions on Microwave Theory and Techniques*, 48, 12 (2000) pp. 2415-2423.
Li, Feng et al., "Coherent emission from ultrathin-walled spiral InGaAs/GaAs quantum dot microtubes," *Optics Letters*, 34, 19 (2009) pp. 2915-2917.
Li, Weizhi et al., "Influences of Process Parameters of Low Frequency PECVD Technology on Intrinsic Stress of Silicon Nitride Thin Film," *Proc. Of SPIE*, 7658 (2010) pp. 765824-1-765824-7.
Li, Xiuling, "Self-rolled-up microtube ring resonators: a review of geometrical and resonant properties," *Advances in Optics and Photonics*, 3 (2011) pp. 366-387.
Li, Xiuling, "Strain induced semiconductor nanotubes: from formation process to device applications," *Journal of Physics D: Applied Physics*, 41 (2008) 193001, pp. 1-12.
Logeeswaran, V. J. et al., "Ultrasmooth Silver Thin Films Deposited with a Germanium Nucleation Layer," *Nano Letters*, 9, 1 (2009) pp. 178-182.
Luchnikov, V. et al., "Toroidal hollow-core microcavities produced by self-rolling of strained polymer bilayer films," *Journal of Micromechanics and Microengineering*, 18 (2008) 035041, pp. 1-5.
Luo, J. K. et al., "Modelling and fabrication of low operation temperature microcages with a polymer/metal/DLC trilayer structure," *Sensors and Actuators A*, 132 (2006) pp. 346-353.
Masi, Maurizio et al., "Modeling of Silicon Nitride Deposition by RF Plasma-Enhanced Chemical Vapor Deposition," *Chemical Engineering Science*, 49, 5 (1994) pp. 669-679.
Mei, Yongfeng et al., "Versatile Approach for Integrative and Functionalized Tubes by Strain Engineering of Nanomembranes on Polymers," *Advanced Materials*, 20 (2008) pp. 4085-4090.
Mi, Zetian et al., "1.3-1.55 µm Self-Organized InAs Quantum Dot Tube Nanoscale Lasers on Silicon," *Photonics Conference (PHO)*, IEEE, Conference Publication (2011) pp. 535-536.
Mitrofanov, Oleg et al., "Reducing Transmission Losses in Hollow THz Waveguides," *IEEE Transactions on Terahertz Science and Technology*, 1, 1 (2011) pp. 124-132.
Mitrofanov, Oleg et al., "Dielectric-lined cylindrical metallic THz waveguides: mode structure and dispersion," *Optics Express*, 18, 3 (2010) pp. 1898-1903.

(56) References Cited

OTHER PUBLICATIONS

Moiseeva, E. et al., "Single-mask microfabrication of three-dimensional objects from strained bimorphs," *Journal of Micromechanics and Microengineering*, 17 (2007) pp. N63-N68.

Müller, Christian et al., "Tuning giant magnetoresistance in rolled-up Co—Cu nanomembranes by strain engineering," *Nanoscale*, 4 (2012) pp. 7155-7160.

Nguyen, Nhat M. et al., "Si IC-Compatible Inductors and LC Passive Filters," *IEEE Journal of Solid-State Circuits*, 25, 4 (1990) pp. 1028-1031.

Pahlevaninezhad, H. et al., "Advances in Terahertz Waveguides and Sources," *IEEE Photonics Journal*, 3, 2 (2011) pp. 307-310.

Pang, Liang et al., "Transfer printing of flexible hybrid inductor-capacitor filters via pre-etched silicon-on-insulator mother wafer," *Applied Physics Letters*, 101, 063113 (2012) pp. 063113-1-063113-4.

Park, Min et al., "The Detailed Analysis of High Q CMOS-Compatible Microwave Spiral Inductors in Silicon Technology," *IEEE Transactions on Electron Devices*, 45, 9 (1998) pp. 1953-1959.

Parvizian, M. et al., "Residual stress improvement of platinum thin film in Au/Pt/Ti/p-GaAs ohmic contact by RF sputtering power," *Applied Surface Science*, 260 (2012) pp. 77-79.

Prinz, V. Ya. et al., "Free-standing and overgrown InGaAs/GaAs nanotubes, nanohelices and their arrays," *Physica E*, 6 (2000) pp. 828-831.

Rottler, Andreas et al., "Rolled-up nanotechnology for the fabrication of three-dimensional fishnet-type GaAs-metal metamaterials with negative refractive index at near-infrared frequencies," *Applied Physics Letters*, 100, 151104 (2012) pp. 151104-1-151104-4.

Schulze, Sabine et al., "Morphological Differentiation of Neurons on Microtopographic Substrates Fabricated by Rolled-Up Nanotechnology," *Advanced Engineering Materials*, 12, 9 (2010), pp. B558-B564.

Seidel, H. et al., "Anisotropic Etching of Crystalline Silicon in Alkaline Solutions," *J. Electrochem. Soc.*, 137, 11 (1990) pp. 3612-3632.

Seleznev, V. A. et al., "Generation and Registration of Disturbances in a Gas Flow. 1. Formation of Arrays of Tubular Microheaters and Microsensors," *Journal of Applied Mechanics and Technical Physics*, 50, 2 (2009) pp. 291-296.

Shacham-Diamand, Yosi et al., "Electroless Silver and Silver with Tungsten Thin Films for Microelectronics and Microelectromechanical System Applications," *Journal of the Electrochemical Society*, 147, 9 (2000) pp. 3345-3349.

Shiplyuk, A. N. et al., "Generation and Registration of Disturbances in a Gas Flow. 2. Experiments with Arrays of Tubular Microheaters and Microsensors," *Journal of Applied Mechanics and Technical Physics*, 50, 3 (2009) pp. 454-458.

Smith, Donald L. et al., "Mechanism of $SiN_xH_y$ Deposition from $NH_3$-$SiH_4$ Plasma," *J. Electrochem. Soc.*, 137, 2 (1990) pp. 614-623.

Smith, Elliot J. et al., "Lab-in-a-Tube: Detection of Individual Mouse Cells for Analysis in Flexible Split-Wall Microtube Resonator Sensors," *Nano Letters*, 11 (2011) pp. 4037-4042.

Songmuang, R. et al., "From rolled-up Si microtubes to $SiO_x$/Si optical ring resonators," *Microelectronic Engineering*, 84 (2007) pp. 1427-1430.

Tang, Chih-Chun et al., "Miniature 3-D Inductors in Standard CMOS Process," *IEEE Journal of Solid-State Circuits*, 37, 4 (2002) pp. 471-480.

Tian, Dongbin et al., "Dual cylindrical metallic grating-cladding polymer hollow waveguide for terahertz transmission with low loss," *Applied Physics Letters*, 97, (2010) pp. 133502-1-133502-3.

Tian, Zhaobing et al., "Controlled Transfer of Single Rolled-Up InGaAs—GaAs Quantum-Dot Microtube Ring Resonators Using Optical Fiber Abrupt Tapers," *IEEE Photonics Technology Letters*, 22, 5 (2010) pp. 311-313.

Tian, Zhaobing et al., "Single rolled-up InGaAs/GaAs quantum dot microtubes integrated with silicon-on-insulator waveguides," *Optics Express*, 19, 13 (2011) pp. 12164-12171.

Timoshenko, S., "Analysis of Bi-Metal Thermostats," *Journal of the Optical Society of America*, 11 (1925) pp. 233-255.

Walmsley, Byron A. et al., "Poisson's Ratio of Low-Temperature PECVD Silicon Nitride Thin Films," *Journal of Microelectromechanical Systems*, 16, 3 (2007) pp. 622-627.

Wang, To-Po et al., "High-Q Micromachined Inductors for 10-to-30-GHz RFIC Applications on Low Resistivity Si-Substrate," *Proceedings of the 36th European Microwave Conference*, (2006) pp. 56-59.

Wheeler, Harold A., "Formulas for the Skin Effect," *Proceedings of the I.R.E.*, (1942) pp. 412-424.

Wiemer, L. et al., "Determination of Coupling Capacitance of Underpasses, Air Bridges and Crossings in MICs and MMICs," *Electronics Letters*, 23, 7 (1987) pp. 344-346.

Xu, Xiangdong et al., "Chemical Control of Physical Properties in Silicon Nitride Films," *Appl. Phys. A.*, 111 (2013) pp. 867-876.

Yue, C. Patrick et al., "A Physical Model for Planar Spiral Inductors on Silicon," *IEEE, IEDM*, 96 (1996) pp. 155-158.

Yue, C. Patrick et al., "Physical Modeling of Spiral Inductors on Silicon," *IEEE Transactions on Electron Devices*, 47, 3 (2000) pp. 560-568.

Yu, Minrui et al., "Semiconductor Nanomembrane Tubes: Three-Dimensional Confinement for Controlled Neurite Outgrowth," *ACS Nano*, 5, 4 (2011) pp. 2447-2457.

Zang, Ji et al., "Mechanism for Nanotube Formation from Self-Bending Nanofilms Driven by Atomic-Scale Surface-Stress Imbalance," *Physical Review Letters*, 98, (2007) pp. 146102-1-146102-4.

Zolfaghari, Alireza et al., "Stacked Inductors and Transformers in CMOS Technology," *IEEE Journal of Solid-State Circuits*, 36, 4 (2001) pp. 620-628.

* cited by examiner

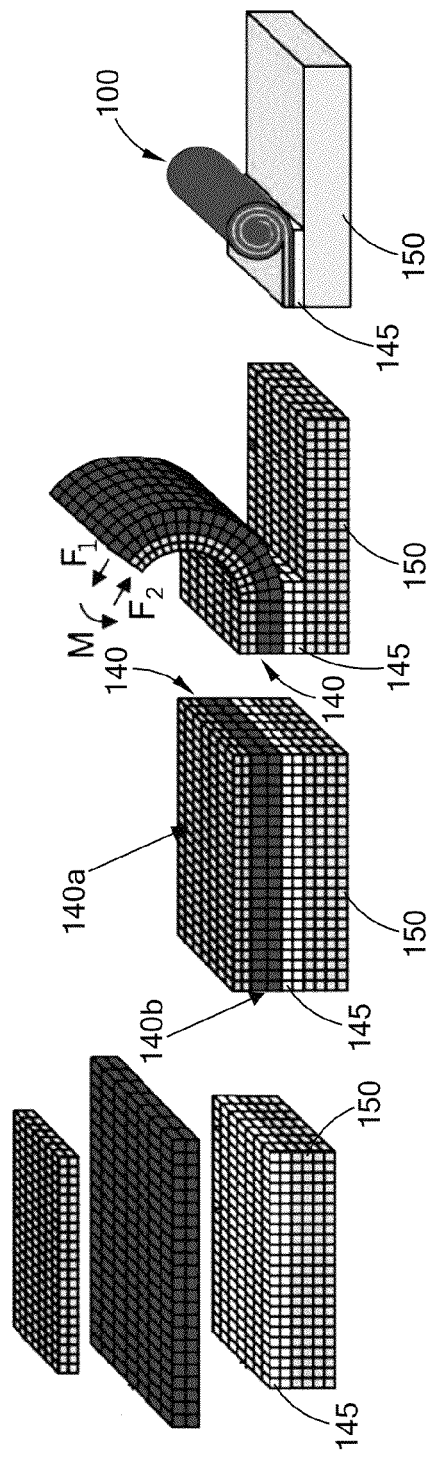

US 8,941,460 B2

ROLLED-UP TRANSFORMER STRUCTURE FOR A RADIOFREQUENCY INTEGRATED CIRCUIT (RFIC)

RELATED APPLICATIONS

The present patent document claims the benefit of priority under 35 U.S.C. 119(e) to U.S. Provisional Patent Application Ser. No. 61/888,833, filed on Oct. 9, 2013, to U.S. Provisional Patent Application Ser. No. 61/818,689, filed on May 2, 2013, and to U.S. Provisional Patent Application Ser. No. 61/712,360, filed on Oct. 11, 2012, all of which are hereby incorporated by reference in their entirety.

Also incorporated by reference in their entirety are the U.S. nonprovisional patent applications entitled "Rolled-up Inductor Structure for a Radiofrequency Integrated Circuit (RFIC)," and "Rolled-up Transmission Line Structure for a Radiofrequency Integrated Circuit (RFIC)," which have the same filing date, Oct. 10, 2013, as the present patent document and which also claim priority to the above-mentioned provisional patent applications.

FEDERALLY SPONSORED RESEARCH OR DEVELOPMENT

This invention was made with government support under award numbers ECCS 0747178 and 1309375 from the National Science Foundation, DE-FG02-07ER46471 from the Department of Energy, and N000141110634 from the Office of Naval Research. The government has certain rights in the invention.

TECHNICAL FIELD

The present disclosure is directed generally to on-chip device structures and more particularly to on-chip transformer structures for radiofrequency integrated circuits (RFICs).

BACKGROUND

On-chip transformers may be used in radiofrequency integrated circuits (RFICs) for impedance matching, signal coupling and phase splitting. Like traditional transformers, on-chip transformers include a primary winding for the signal input and a secondary winding for the signal output. A varying current in the primary winding creates a varying magnetic flux in the transformer's air core, and thus a varying magnetic flux through the secondary winding. This varying magnetic flux induces a varying electromotive force (EMF), or voltage in the secondary winding. This effect is called inductive coupling. If a load is connected to the secondary winding, current will flow in this winding, and electrical energy will be transferred from the primary circuit through the transformer to the load. Transformers may be used for AC-to-AC conversion of a single power frequency or for conversion of signal power over a wide range of frequencies. For on-chip applications, it is advantageous to reduce the footprint of the transformer while achieving a desirable coupling coefficient.

BRIEF SUMMARY

According to a first embodiment, a rolled-up on-chip transformer structure for a radiofrequency integrated circuit (RFIC) comprises a multilayer sheet in a rolled configuration comprising multiple turns about a longitudinal axis. The multilayer sheet comprises a conductive pattern layer on a strain-relieved layer, where the conductive pattern layer comprises a first conductive film and a second conductive film separated from the first conductive film in a rolling direction. The first conductive film comprises an even number of primary conductive strips, where each of the primary conductive strips has a length extending in the rolling direction, and the second conductive film comprises an even number of secondary conductive strips, where each of the secondary conductive strips has a length extending in the rolling direction. In the rolled configuration, the primary conductive strips wrap around the longitudinal axis, and the secondary conductive strips wrap around the primary conductive strips. The primary conductive strips serve as a primary winding and the secondary conductive strips serve as a secondary winding of the rolled-up transformer structure.

According to a second embodiment, a rolled-up transformer structure for a RFIC comprises a multilayer sheet having a rolled configuration comprising multiple turns about a longitudinal axis. The multilayer sheet comprises more than one conductive pattern layer on a strain-relieved layer, where the more than one conductive pattern layer comprises a first conductive film and a second conductive film separated from the first conductive film in a thickness direction. The first conductive film comprises an even number of primary conductive strips, where each primary conductive strip has a length extending in the rolling direction, and the second conductive film comprises an even number of secondary conductive strips, where each secondary conductive strip has a length extending in the rolling direction. In the rolled configuration, turns of the primary conductive strips and turns of the secondary conductive strips wrap around the longitudinal axis, the primary conductive strips being a primary winding and the secondary conductive strips being a secondary winding of the rolled-up transformer structure.

A method of making a rolled-up transformer structure for a radiofrequency integrated circuit includes forming a sacrificial layer on a substrate and forming a strained layer on the sacrificial layer, where the strained layer typically comprises an upper portion under tensile stress and a lower portion under compressive stress. The strained layer is held on the substrate by the sacrificial layer. One or more conductive pattern layers are formed on the strained layer. The conductive pattern layer(s) may include a first conductive film separated from a second conductive film in a thickness direction or in a rolling direction. The first conductive film comprises an even number of primary conductive strips, where each primary conductive strip has a length extending in the rolling direction, and the second conductive film comprising an even number of secondary conductive strips, where each secondary conductive strip has a length extending in the rolling direction. Removal of the sacrificial layer from the substrate is initiated, thereby releasing an end of the strained layer, and removal of the sacrificial layer is continued, thereby allowing the strained layer to move away from the substrate and roll up to relieve strain in the strained layer. The conductive pattern layer(s) adhere to the strained layer during the roll-up and a rolled-up transformer structure is formed, where, after the roll-up, turns of the primary conductive strips and turns of the secondary conductive strips wrap around the longitudinal axis. The primary conductive strips serve as a primary winding and the secondary conductive strips serve as a secondary winding of the rolled-up transformer structure.

BRIEF DESCRIPTION OF THE DRAWINGS

FIGS. 1A-1B show an exemplary strained bilayer comprising a top sublayer in tension and a bottom sublayer in compression deposited on a sacrificial layer on a substrate, and FIGS. 1C-1D show schematically the release and subsequent roll-up of the bilayer from the underlying sacrificial layer.

DETAILED DESCRIPTION

Described herein are three-dimensional (3D) transformer structures formed in a self-rolling process that may have a greatly reduced on-chip footprint and significant performance improvement in RFICs. Such transformer structures have a carefully designed planar structure that is engineered to impart the desired dimensions and functionality upon roll-up.

Figure 2A:
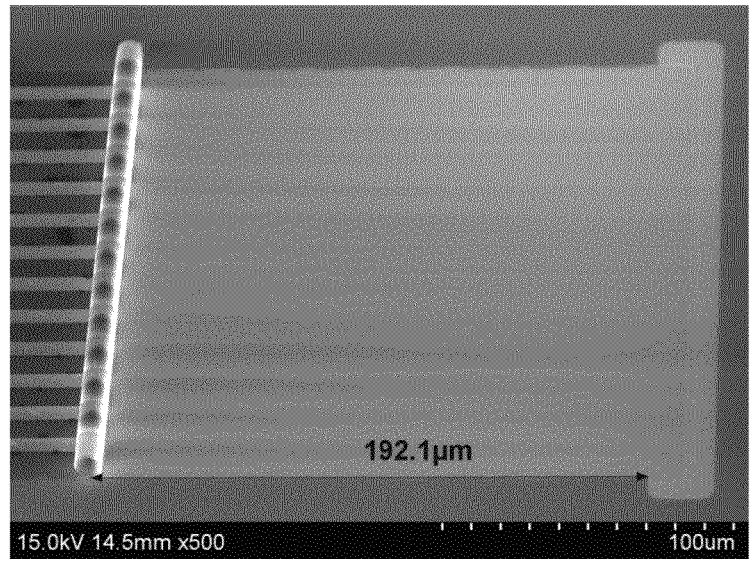
FIGS. 2A and 2B are scanning electron microscope (SEM) images showing respective top- and cross sectional-views of a rolled up SiNx sheet (membrane) including multiple turns with an inner diameter of 8.2 microns.
Figure 2B:
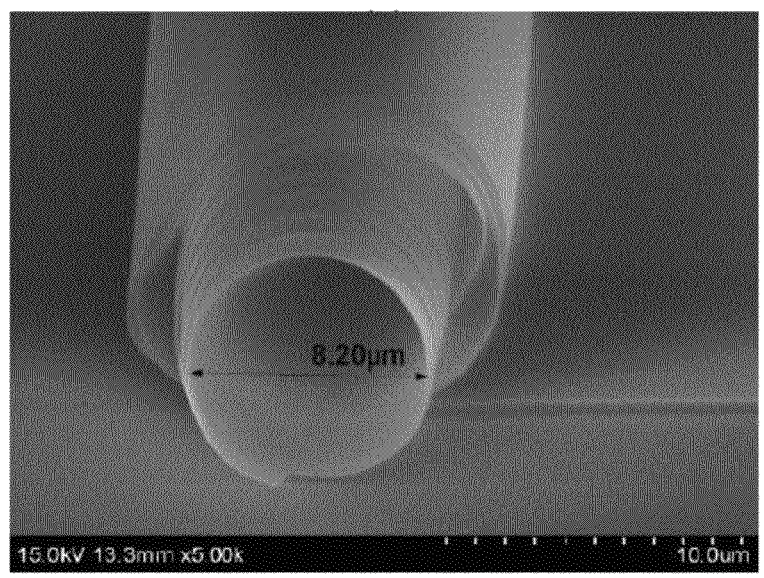

FIGS. 1A-1D provide an introduction to the self-rolling concept. Rolled-up micro- and nanotubular device structures form spontaneously when strained planar sheets or membranes deform as a consequence of energy relaxation. A strained membrane may include a conductive pattern layer on an oppositely strained bilayer 140 (e.g., a top layer 140a in tension on a bottom layer 140b in compression), which is in contact with a sacrificial interlayer 145 on a substrate 150. The oppositely strained bilayer 140 may be released from the substrate 150 when the sacrificial layer 145 is etched away. Once released, the opposing strain within the bilayer 140 generates a net momentum, driving the planar membrane to scroll up and continue to roll into a tubular spiral structure 100. The conductive pattern layer itself can also provide additional residual stress (e.g., tensile stress) to facilitate rolling. The scanning electron microscope (SEM) images of FIGS. 2A and 2B show an exemplary strain-relieved sheet or membrane after self-rolling to an inner diameter of 8.2 microns. The rolled-up sheet of this example comprises non-stoichiometric silicon nitride ($SiN_x$).

Figure 3A:
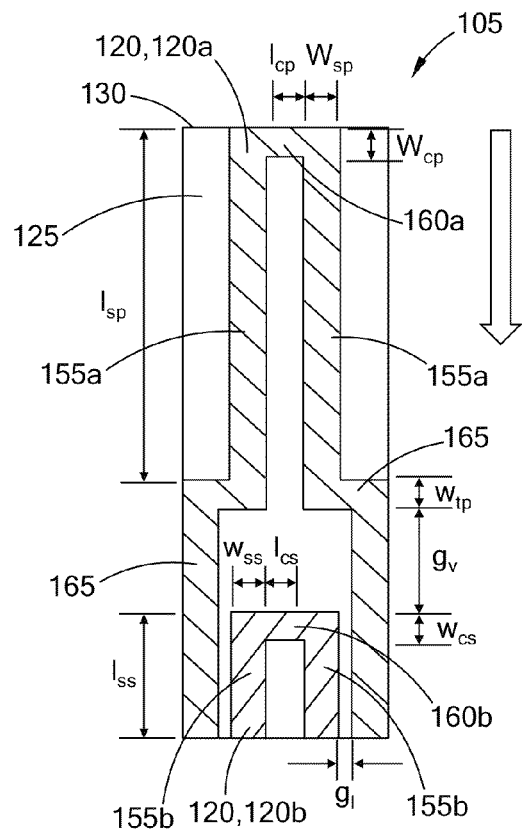
FIG. 3A shows a planar multilayer sheet comprising a conductive pattern layer on a strained layer prior to rolling up.
Figure 3B:
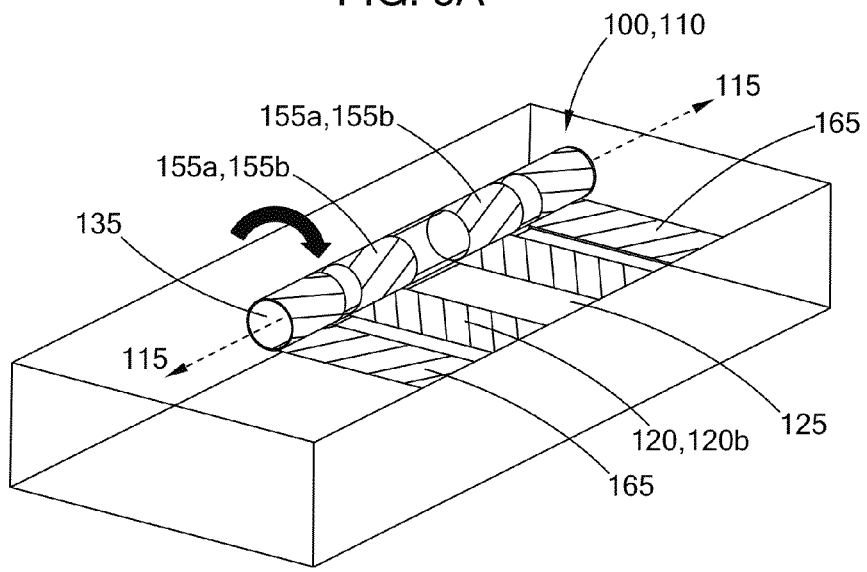
FIG. 3B shows a schematic of a rolled-up transformer structure, according to a first embodiment, that includes the conductive pattern layer illustrated in FIG. 3A.
Figure 4A:
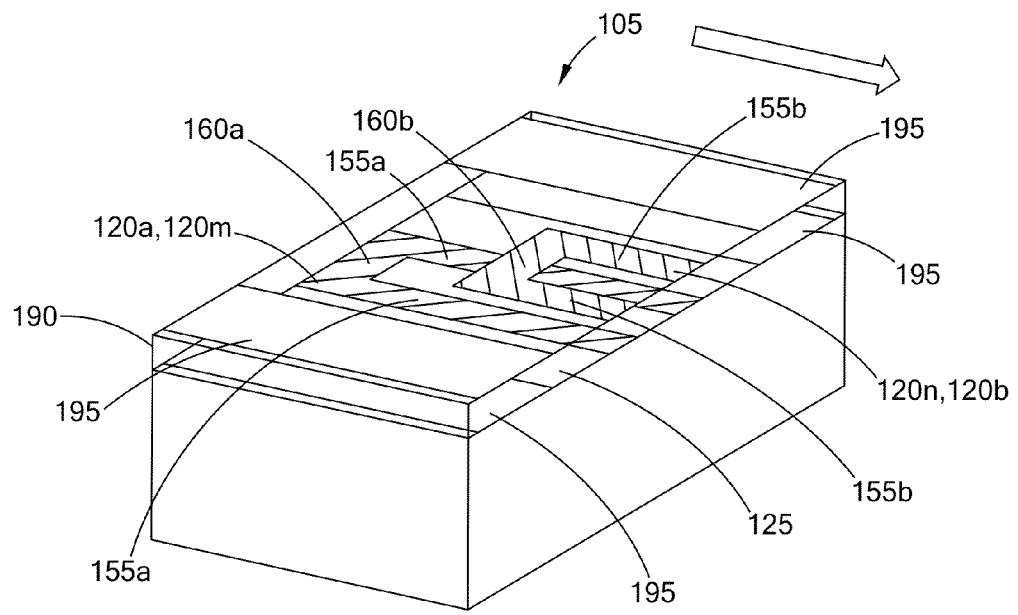
FIG. 4A shows a planar multilayer sheet comprising more than one conductive pattern layer on a strained layer prior to rolling up, where the second conductive pattern is above the first conductive pattern.
Figure 4B:
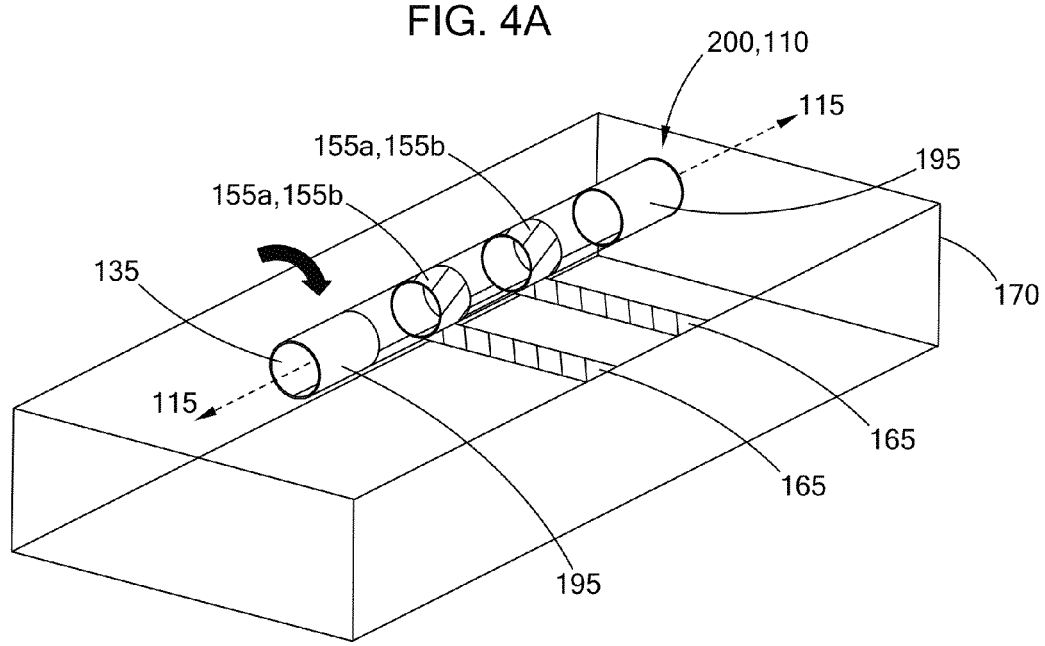
FIG. 4B shows a schematic of a rolled-up transformer structure, according to a second embodiment, that includes the conductive pattern layers 120 illustrated in FIG. 4A.

FIG. 3A shows a planar multilayer sheet 105 comprising a conductive pattern layer 120 on a strained layer 125 prior to rolling up, and FIG. 3B shows a schematic of a rolled-up transformer structure 100 that includes the conductive pattern layer 120 of FIG. 3A after full or partial relaxation of the residual stress in the strained layer 125. Similarly, FIG. 4A shows a planar multilayer sheet 105 comprising more than one conductive pattern layer 120m,120n on a strained layer 125 prior to rolling up, and FIG. 4B shows a schematic of a rolled-up transformer structure 200 that includes the conductive pattern layers 120m,120n of FIG. 4A after full or partial relaxation of the residual stress in the strained layer 125. Accordingly, after rolling, the strained layer 125 may be referred to as the strain-relieved layer 125.

Referring again to FIGS. 3A and 3B, the rolled-up transformer structure 100 comprises a multilayer sheet 105 in a rolled configuration 110 including multiple turns about a longitudinal axis 115. The multilayer sheet 105 comprises a conductive pattern layer 120 on a strain-relieved layer 125, where the conductive pattern layer 120 comprises a first conductive film 120a and a second conductive film 120b separated from the first conductive film 120a in the rolling direction, or circumferential direction, as indicated by the arrows. The transformer design of FIGS. 3A and 3B may be referred to as a first embodiment and/or a type I transformer.

The first conductive film 120a comprises an even number (e.g., 2, 4, 6, 8, etc.) of primary conductive strips 155a, where each of the primary conductive strips 155a has a length extending in the rolling direction. The length of each of the primary conductive strips 155a may be aligned substantially parallel to (e.g., within ±1° of) the rolling direction. The primary conductive strips 155a are positioned side-by-side; that is, they are disposed adjacent to each other in the direction of the longitudinal axis, and they may be interconnected. Each of the primary conductive strips 155a may have an elongated rectangular shape when the multilayer sheet 105 is in an unrolled configuration, and a rolled-up elongated rectangular shape when the multilayer sheet 105 is in the rolled configuration 110.

Similarly, the second conductive film 120b comprises an even number of secondary conductive strips 155b, where each of the secondary conductive strips 155b has a length extending in the rolling direction. The length of each of the secondary conductive strips 155b may be aligned substantially parallel to (e.g., within ±1° of) the rolling direction. The secondary conductive strips 155b are positioned side-by-side; that is, they are disposed adjacent to each other in the direction of the longitudinal axis, and they may be interconnected. Each of the secondary conductive strips 155b may have an elongated rectangular shape when the multilayer sheet 105 is in an unrolled configuration, and a rolled-up elongated rectangular shape when the multilayer sheet 105 is in the rolled configuration 110.

According to the first embodiment, the primary and secondary conductive strips 155a,155b are separated from each other on the strain-relieved layer by a circumferential or rolling distance $g_y$. The term "separated," as used in the present disclosure, may refer to physical separation and/or to electrical isolation. When the planar multilayer sheet 105 of FIG. 3A is rolled up, the primary conductive strips 155a wrap around the longitudinal axis 115 and the secondary conductive strips 155b wrap around the primary conductive strips 155a. The primary conductive strips 155a serve as a primary winding and the secondary conductive strips 155b serve as a secondary winding of the rolled-up transformer structure 100. Functionally, after rolling up, all of the primary windings may be contained within the secondary windings, in the first embodiment. The primary conductive strips 155a and the secondary conductive strips 155b may be partially or completely overlapped in the rolled configuration. The underlying strain-relieved layer 125 may serve as an electrical isolation layer between turns of the primary and secondary conductive strips 155a, 155b. The first conductive film 120a and the second conductive film 120b, and thus the primary and secondary conductive strips 155a,155b, may be coaxial in the rolled configuration 110.

The circumferential distance $g_v$ separating the first and second conductive strips on the strain-relieved layer is preferably sufficiently large so that the coupling capacitance $C_{ps}$ may be reduced. The distance $g_v$ may be at least about 30 microns, at least about 50 microns, at least about 70 microns, or at least about 100 microns. However, a large circumferential distance $g_v$ may lead to an increased number of feed windings, and thus a compromise in the distance $g_v$ may be advantageous. Typically, the distance $g_v$ is no more than about 200 microns, and $g_v$ may be no more than about 150 microns, or no more than about 100 microns. Also, it may be beneficial to construct the rolled-up transformer without the feed windings. If, for example, the rolled-up transformer is integrated with other electronic devices, feed windings may not be necessary.

Figure 4C:
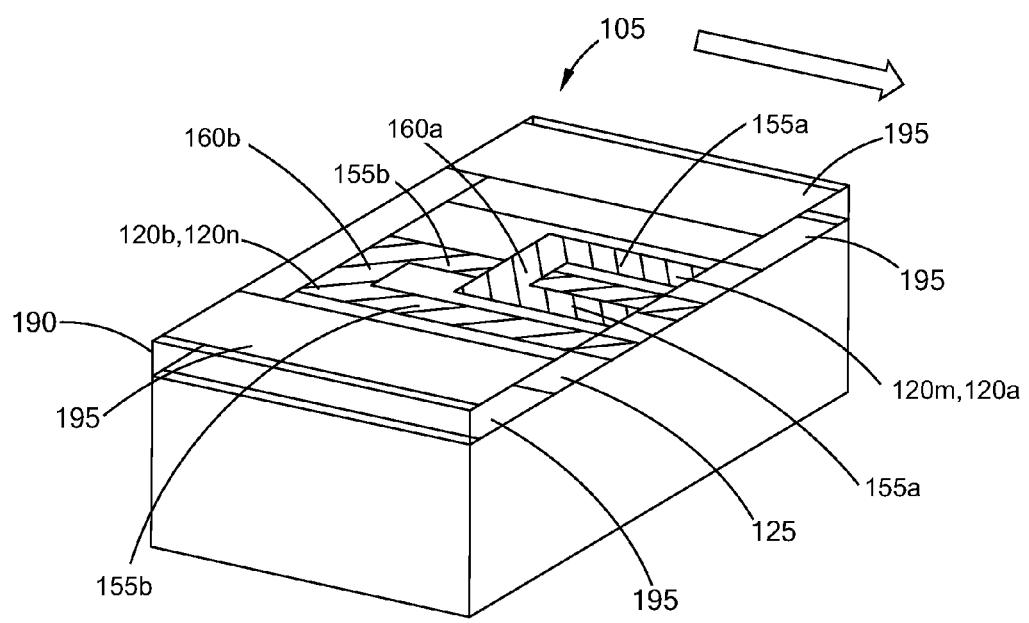
FIG. 4C shows a planar multilayer sheet comprising more than one conductive pattern layer on a strained layer prior to rolling up, where the first conductive pattern is above the second conductive pattern.
Figure 5:
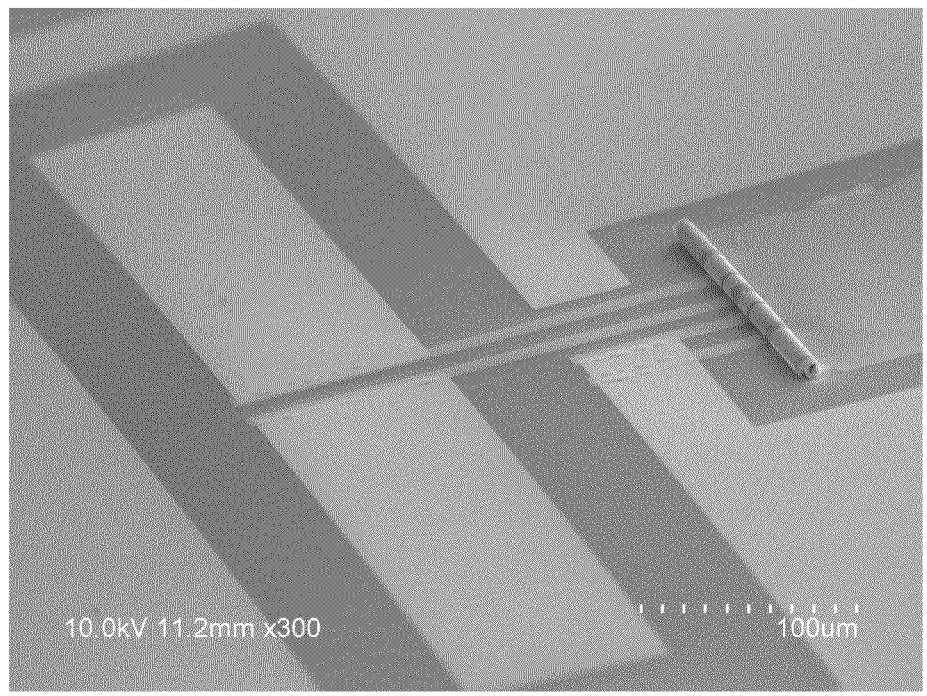
FIG. 5 shows an SEM image of a rolled-up (or microtube) transformer according to the first embodiment.

According to the second embodiment, the rolled-up transformer structure 200 comprises a multilayer sheet 105 in a rolled configuration 110 including multiple turns about a longitudinal axis 115. The multilayer sheet 105 comprises more than one conductive pattern layer 120m,120n on a strain-relieved layer 125, where the conductive pattern layers 120m,120n comprise a first conductive film 120a separated from a second conductive film 120b in a thickness direction, as shown schematically in FIG. 4A. The thickness direction may be understood to be normal to the strained or strain-relieved layer 125. In this example, the second conductive film 120b is disposed above the first conductive film 120a on the strain-relieved layer 125, although it is also possible for the second conductive film 120b to be disposed below the first conductive film 120a on the strain-relieved layer 125, as illustrated in FIG. 4C. An intermediate layer 190 comprising an insulating material may be disposed between the first conductive film 120a and the second conductive film 120a. The transformer design of FIGS. 4A-4C may be referred to as the second embodiment and/or as a type II transformer.

Referring to FIG. 4A, the first conductive film 120a comprises an even number (e.g., 2, 4, 6, 8, etc.) of primary conductive strips 155a, where each of the primary conductive strips 155a has a length extending in the rolling direction. The length of each of the primary conductive strips 155a may be aligned substantially parallel to (e.g., within ±1° of) the rolling direction. The primary conductive strips 155a are positioned side-by-side; that is, they are disposed adjacent to each other in the direction of the longitudinal axis, and they may be interconnected. Each of the primary conductive strips 155a may have an elongated rectangular shape when the multilayer sheet 105 is in an unrolled configuration, and a rolled-up elongated rectangular shape when the multilayer sheet 105 is in the rolled configuration.

Similarly, the second conductive film 120b comprises an even number of secondary conductive strips 155b, where each of the secondary conductive strips 155b has a length extending in the rolling direction. The length of each of the secondary conductive strips 155b may be aligned substantially parallel to (e.g., within ±1° of) the rolling direction. The secondary conductive strips 155b are positioned side-by-side; that is, they are disposed adjacent to each other in the direction of the longitudinal axis, and they may be interconnected. Each of the secondary conductive strips 155b may have an elongated rectangular shape when the multilayer sheet 105 is in an unrolled configuration, and a rolled-up elongated rectangular shape when the multilayer sheet 105 is in the rolled configuration.

According to the second embodiment, the first and second conductive films 120a,120b, and thus the primary and secondary conductive strips 155a,155b, are separated from each other in the thickness direction. The separation distance, which may be from about 1 nm to about 1 micron, and is more typically from about 1 nm to about 300 nm or from about 10 nm to about 100 nm, may be defined by the thickness of an intermediate layer between the first and second conductive films. When the planar multilayer sheet 105 of FIG. 4A is rolled up, the first conductive film 120a and the second conductive film 120b wrap around the longitudinal axis 115, such that turns of the secondary conductive strips 155b lie between turns of the primary conductive strips 155a, or such that turns of the primary conductive strips 155a lie between turns of the secondary conductive strips 155b. In either case, the primary conductive strips 155a and the secondary conductive strips 155b may be partially or completely overlapped in the rolled configuration. The primary conductive strips 155a serve as a primary winding and the secondary conductive strips 155b serve as a secondary winding of the rolled-up transformer structure 200. Functionally, after rolling up, the secondary winding may be contained within the primary winding in the second embodiment, as shown in FIGS. 4A and 4B. The underlying strain-relieved layer 125 and/or the intermediate layer 190 may serve as an electrical isolation layer between turns of the primary and secondary conductive strips 155a, 155b. The first conductive film 120a and the second conductive film 120b, and thus the primary and secondary conductive strips 155a,155b, may be coaxial in the rolled configuration 110.

The number of turns completed by each of the primary and secondary conductive strips 155a,155b about the longitudinal axis 115—which in turn determines the number of rotations of the primary and secondary windings—is a function of the respective lengths of the primary and secondary conductive strips 155a,155b. As shown in FIG. 3A and applicable to both the first and second embodiments, the length $l_{sp}$ of the primary conductive strips 155a may be longer than the length $l_{ss}$ of the secondary conductive strips 155b. Consequently, the primary conductive strips 155a may complete more turns about the longitudinal axis 115 than the secondary conductive strips 155b, such that the turn ratio of the primary to the secondary windings is greater than 1 (e.g., 2:1 or greater, 3:1 or greater, up to 5:1). For a given turn ratio, it may be beneficial in some cases to have a large number of turns for both the primary and secondary windings, such as when a high maximum gain is required in the low frequency band and low off-state power consumption is desired. For example, to achieve a 2:1 turn ratio, it may be preferred to have at 40 turns of the primary windings and 20 turns of the secondary windings over the simplest case of 2 turns to 1 turn. It is also contemplated that the primary conductive strips and the secondary conductive strips may have the same length (turn ratio equal to 1), or, in some embodiments, the secondary conductive strips 155b may be longer than the primary conductive strips 155a (turn ratio of less than 1), as illustrated in FIG. 4C. Generally speaking, the primary conductive strips 155a may complete from 1 to 100 turns about the longitudinal axis 115, for example, at least 10 turns, at least 20 turns, at least 30 turns, at least 40 turns, or at least 50 turns, and typically no more than 100 turns. The secondary conductive strips 155b may complete from 1 to 100 turns about the longitudinal axis 115, for example, at least 5 turns, at least 10 turns, at least 15 turns, at least 20 turns, at least 25 turns, and typically no more than 100 turns, or no more than 50 turns.

Referring again to FIG. 3A, and applicable to both the first and second embodiments, the length of the primary conductive strips 155a $I_{sp}$ may be at least about 20 microns, at least about 40 microns, at least about 60 microns, at least about 80 microns, or at least about 100 microns. Typically, $I_{sp}$ is no greater than about 2 mm, no greater than 1 mm, no greater than about 500 microns, or no greater than about 200 microns. For example, $I_{sp}$ may range from about 50 microns to about 150 microns, or from about 70 microns to about 100 microns. The length of the secondary conductive strips $I_{ss}$ may be at least about 5 microns, at least about 10 microns, at least about 15 microns, at least about 20 microns, or at least about 50 microns. Typically, $I_{ss}$ is no greater than about 2 mm, no greater than 1 mm, no greater than about 500 microns, no greater than about 200 microns, no greater than about 100 microns, no greater than about 50 microns, or no greater than about 30 microns. For example, $I_{ss}$ may range from about 10 microns to about 20 microns. The primary conductive strips have a width $w_{sp}$ and the secondary conductive strips have a width $w_{ss}$, where $w_{sp}$ and $w_{ss}$ typically have values from about 5 microns to about 25 microns. The widths $w_{sp}$ and $w_{ss}$ of each of the primary and secondary conductive strips 155a,155b may be the same so that the primary and secondary windings of the rolled-up transformer structure overlap. For this reason, the spacing between the first conductive strips 155a and the spacing between the second conductive strips 155b, as discussed below, may also be the same.

Also in both the first and second embodiments, the primary conductive strips 155a may be connected by a first connecting line 160a, which may have a length $I_{cp}$ extending in a direction of the longitudinal axis. Accordingly, the length $I_{cp}$ of the first connecting line 160a may define the spacing between the primary conductive strips 155a. The length $I_{cp}$ of the first connecting line 160a, and/or the spacing between the primary conductive strips 155a, typically lies in the range of from about 5 microns to about 25 microns, or from about 10 microns to about 20 microns. The first connecting line 160a has a width $w_{cp}$ that may lie in the range of from about 1 micron to about 10 microns. The width of the connecting lines 160a affects their electrical resistance and inductance. If the width is chosen to be too large, it may introduce a large capacitance; however, if the width is too small, it may introduce a large resistance. As shown in FIGS. 3A and 4A, the first connecting line 160a may extend along a first edge 130 of the multilayer sheet 105, and a first turn of the rolled configuration 110 that includes the first edge 130 of the sheet may thus include the first connecting line 160a. The first turn of the rolled configuration 115 may define a hollow cylindrical core 135 of the rolled-up transformer structure 100.

Still referring to FIGS. 3A and 4A, the secondary conductive strips 155b may be connected by a second connecting line 160b, which may have a length $I_{cs}$ extending in a direction of the longitudinal axis 115. Accordingly, the length $I_{cs}$ of the second connecting line 160b may define the spacing between the secondary conductive strips 155b. The length $I_{cp}$ of the second connecting line 160b, and/or the spacing between the secondary conductive strips 155b, typically lies in the range of from about 5 microns to about 25 microns, or from about 10 microns to about 20 microns. The second connecting line 160b has a width $w_{cs}$ that may lie in the range of from about 1 micron to about 10 microns. As noted above, the width of the connecting lines 160b affects their electrical resistance and inductance. If the width is chosen to be too large, it may introduce a large capacitance; however, if the width is too small, it may introduce a large resistance.

In the first embodiment shown in FIGS. 3A and 3B, the first conductive film 120a may further include two conductive feed lines 165 connected to end portions thereof. The conductive feed lines 165 may extend away from the primary conductive strips 155a in the rolling or circumferential direction, as shown in the figures. Alternatively, the conductive feed lines 165 may extend away from the primary conductive strips 155a in another direction(s), such as in the same or opposing directions substantially parallel to (e.g., within ±1° of) the longitudinal axis 115 of the rolled structure 100. The main function of the conductive feed lines 165 is to lead the signal in and out of the primary windings. After rolling up, the conductive feed lines 165 form conductive feed windings that may contribute to the signal transforming; however, they may also reduce the overall coupling coefficient. Accordingly, in some cases, conductive feed lines may not be part of the rolled structure, as is the case in the second embodiment of FIG. 4B, although conductive feed lines 165 may be present on the substrate 170 to contact the primary conductive strips 155a. Also, if the transformer of the first embodiment is integrated with other passive and/or active components on a chip, then it may be possible to feed the signal into the primary winding directly from another component(s), and conductive feed lines may not be needed. When conductive feed lines are present, they may be integrally formed with the first conductive film 120a and/or second conductive film 120b during fabrication (e.g., thin film deposition and patterning).

As shown in FIG. 4A, the conductive pattern layer(s) 120m,120n may further include support film strips 195 positioned outside the conductive strips 155 on the strained layer 125 to facilitate an even rolling process. This may be particularly advantageous when the length of the conductive strips 155 is long and the rolled configuration 110 includes a large number of turns. The support film strips 195 corresponding to a given conductive pattern layer 120m,120n may have the same thickness as the conductive strips 155a,155b of that layer.

The strain-relieved layer 125 that underlies the conductive pattern layer(s) 120m, 120n may comprise one or more sublayers that are at least partially relieved of lattice strain as a consequence of rolling. The multilayer sheet comprising the strain-relieved layer includes less lattice strain (or no lattice strain) in the rolled configuration than in an unrolled or planar configuration. Accordingly, the one or more sublayers that are referred to as a strain-relieved layer in the rolled configuration may be referred to as a strained layer in the unrolled configuration.

In the example of FIGS. 1A-1D, the strain-relieved layer (and the strained layer) may comprise two sublayers, which may be referred to as a bilayer. Specifically, the strained layer or bilayer 140 may comprise a top sublayer 140a in tension and a bottom sublayer 140b in compression to facilitate the rolling up shown schematically in FIGS. 1C-1D. The bilayer 140 may thus be referred to as an oppositely strained bilayer. The strain-relieved layer and the strained layer may comprise a single crystalline, polycrystalline or amorphous material.

The strain-relieved and strained layer may comprise an electrically insulating material such as silicon nitride, silicon oxide, or boron nitride. For example, the layer may comprise non-stoichiometric silicon nitride ($SiN_x$, where x may have a value from about 0.5 to about 1.5), which may be amorphous, or stoichiometric silicon nitride (e.g., $Si_3N_4$, $Si_2N$, SiN or $Si_2N_3$). The layer may also or alternatively include another material, such as an elemental or compound semiconducting material or a polymer. For example, single crystal films such as InAs/GaAs, InGaAs/GaAs, InGaAsP/InGaAsP, Si—Ge/Si may be used as the strained layer.

Typically, the strained layer has a thickness of from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer includes two oppositely strained sublayers (a bilayer), it may be advantageous for the sublayers to have the same thickness.

The strain in the strained layer may be introduced by compositional or structural differences between sublayers that are successively deposited (e.g., by chemical vapor deposition) so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a,140b may be reversed (compressive on top; tensile on bottom) in order to having the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD differ from single crystal films in that internal strain may not be developed by crystal lattice mismatch but rather by density differences and thermal mismatch achieved by appropriate deposition conditions.

It has been demonstrated experimentally that thin films deposited by different methods or under different conditions may provide a strained layer having adjustable values of residual stress in a wide range, such as from 478 to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a long enough distance to form as many turns as needed. To create a higher residual stress mismatch during deposition of the strained $SiN_x$ layers, for example, and thus a smaller tube diameter, the PECVD environment may be changed by adjusting a ratio of the $SiH_4$ flow rate to the $NH_3$ flow rate or by optimizing the power of the RF source. As long as the thin sheet or membrane is strained and can be released from the underlying substrate, rolled-up 3D architectures may form spontaneously with simple planar processing. The concept has been demonstrated for compound and elemental semiconductor material systems as well metal and dielectric materials, including silicon nitride.

The conductive pattern layer(s) may comprise one or more high conductivity materials selected from the group consisting of carbon, silver, gold, aluminum, copper, molybdenum, tungsten, zinc, palladium, platinum and nickel. For example, graphene and/or metallic dichalcogenides such as $MoS_2$, $MoSe_2$, $WS_2$ and $WSe_2$ may be suitable. The conductive pattern layer(s) may be formed by depositing one or more high conductivity thin films on a substrate (e.g., a planar strained layer) by a method such as sputtering or evaporation, and then patterning the thin films using lithography and etching steps known in the art to create a conductive pattern. As noted above, the conductive pattern layer(s) may include additional tensile strain to facilitate rolling when the sacrificial layer is removed. Advantageously, the conductive pattern layer(s) may be made as thick and smooth as possible to reduce the thin film or sheet resistivity without interfering with the rolling process. The sheet resistivity of the conductive pattern layer(s) may have a significant impact on the performance and size of the rolled-up structure and is kept as low as possible. For example, the sheet resistivity may be about 5 μohm·cm or less.

The conductive pattern layer(s) may have a multilayer structure, such as a Ni—Au—Ni trilayer structure. In such cases, the bottom layer may act as an adhesion layer, the middle layer may act as a conductive layer, and the top layer may act as a passivation/protection layer. Typically, adhesion and passivation layers have a thickness of from about 5-10 nm. As described above, the conductive pattern layer(s) may include a first conductive film separated from a second conductive film on the strain-relieved layer in a thickness direction or in a rolling direction. In addition, each of the first and second conductive films may have a different thickness and/or include one or more different high conductivity materials.

It is also contemplated that the conductive pattern layer(s) may comprise a two-dimensional material, such as graphene or transition metal dichalcogenides, e.g., $MoS_2$ $MoSe_2$, $WSe_2$ and/or $WS_2$. Such two-dimensional materials can be viewed as free-standing atomic planes comprising just a single monolayer or a few monolayers of atoms. For example, the conductive pattern layer may comprise a few monolayers of graphene formed on a strained $SiN_x$ bilayer, or a single monolayer of graphene may be formed on hexagonal boron nitride, which may replace the strained $SiN_x$ bilayer. It is also contemplated that the conductive pattern layer may comprise carbon nanotubes (in the form of bundles or an array) that may be grown on, for example, a quartz substrate and then transferred to a strained SiNx bilayer for roll-up.

Typically, the conductive pattern layer(s) may have a thickness of at least about 5 nm, at least about 10 nm, at least about 20 nm, at least about 50 nm, at least about 70 nm, or at least about 90 nm. The thickness may also be about 200 nm or less, about 150 nm or less, or about 100 nm or less. For example, the thickness may range from about 10 nm to about 100 nm, or from about 20 nm to about 80 nm. However, in some embodiments, such as those in which the conductive pattern layer comprises a two-dimensional material as discussed above, the thickness may be about 1 nm or less, down to a few monolayers or to one monolayer.

The sacrificial layer may comprise a material that can be etched without removing or otherwise damaging the strained layer. For example, single crystalline and/or polycrystalline Ge, $GeO_x$, Si, and AlAs, as well as photoresist, may be used as a sacrificial layer. In one example, a strained bilayer comprising InAs/GaAs may be formed on a sacrificial layer comprising AlAs that may be etched away with hydrofluoric acid (HF).

The intermediate layer 190 that may be present in the second embodiment may comprise a low permittivity material such as silicon dioxide and/or another material such as carbon-doped $SiO_2$ (black diamond), SiLK, or nanoglass. The intermediate layer may have a thickness of from about 1 nm to about 200 nm, or from about 1 nm to about 100 nm, or from about 10 nm to about 50 nm.

The rolled configuration of the multilayer sheet has a length along the longitudinal axis that may depend on the design of the conductive pattern layer (e.g., the number and dimensions of the conductive strips and the presence of side support film strips). Typically, the length is at least about at least about 50 microns, at least about 100 microns, at least about 300 microns, at least about 500 microns, at least about 800 microns, or at least about 1000 microns, and the length may also be about 3000 microns or less, about 2000 microns or less, or about 1000 microns or less. For example, the length may range from about 300 microns to about 3000 microns, or from about 500 microns to about 2000 microns, or from about 500 microns to about 1000 microns.

The inner diameter of the rolled configuration depends on the thickness of the multilayer sheet as well as the amount of strain in the unrolled strained layer prior to release of the sacrificial layer. A thicker multilayer sheet may tend to roll to a larger inner diameter; however, a higher level of strain in the strained layer can offset this effect, since the inner diameter (D) of the rolled configuration is proportional to the thickness (t) of the multilayer sheet and is inversely proportional to the amount of strain ($\in$) therein (D$\propto$t/$\in$). In addition, the rolled configuration of the multilayer sheet may have a diameter (inner diameter) of from about 1 micron to about 50 microns, from about 10 microns to about 30 microns, or from about 3 microns to about 8 microns. Typically, the inner diameter of the rolled configuration is no more than about 50 microns, no more than about 30 microns, no more than about 20 microns, or no more than about 10 microns. The inner diameter may also be at least about 1 micron, at least about 4 microns, or at least about 8 microns. However, in some cases, such as when a few monolayers or just a single monolayer of a two-dimensional material is employed as the conductive film, and/or when the strained layer comprises single crystal films, the inner diameter of the rolled configuration may be significantly smaller due to the reduced sheet thickness. For example, the inner diameter may be no more than 100 nm, no more than 40 nm, no more than 10 nm, or no more than 5 nm, and typically the inner diameter is at least about 1 nm.

To maximize the performance of the rolled-up transformer structures, it may be advantageous to maximize the ratio of the thickness of the conductive pattern layer (e.g., the thickness of the conductive strips) to the inner diameter of the rolled configuration. For example, the ratio may be about 0.005 or greater, about 0.007 or greater, about 0.01 or greater, or about 0.015 or greater. The ratio is typically about 0.03 or less, or about 0.02 or less. In one example, a ratio of 0.01 can be calculated for a conductive pattern layer thickness of 100 nm (0.1 micron) and a rolled configuration diameter of 10 microns.

Depending on (a) the length of the multilayer sheet in the rolling or circumferential direction, (b) the thickness t of the multilayer sheet, and (c) the amount of strain $\in$ in the multilayer sheet prior to rolling, the rolled configuration may include at least about 5 turns, at least about 10 turns, at least about 20 turns, at least about 40 turns, at least about 60 turns, or at least about 80 turns. Typically, the rolled configuration includes no more than about 120 turns, or no more than about 100 turns. For example, the number of turns may range from about 20 turns to about 80 turns, or from about 40 turns to about 60 turns. The number of turns can be influenced by the size (e.g., length and thickness) and shape of the multilayer sheet before rolling up.

To reduce the total resistance of the tube transformers and increase the maximum power gain in the low frequency band, thicker conductive strips and more turns in the rolled configuration may be beneficial. Recent experiments on the type II transformer structure show that 40 to 50 turns (or more) may be achieved from a multilayer sheet of 700 nm in total thickness that includes two primary and two secondary conductive strips on a $SiN_x$ bilayer structure.

An inherent advantage of the rolled-up transformer structure is a small on-wafer footprint compared to alternative planar transformer geometries. On-wafer footprints (areas) of less than 3000 $\mu m^2$ and even less than 1000 $\mu m^2$ have been demonstrated for rolled-up device structures. In general, the approach described herein is useful for making rolled-up transformer structures having a footprint of about 10,000 $\mu m^2$ or less, about 5000 $\mu m^2$ or less, or about 3000 $\mu m^2$ or less, about 1000 $\mu m^2$ or less, about 500 $\mu m^2$ or less, or about 300 $\mu m^2$ or less. The footprint is typically at least about 100 $\mu m^2$, or at least about 200 $\mu m^2$.

The device designs described herein may greatly reduce the footprint of on-chip transformers, the related substrate loss and substrate parasitic capacitance. An ideal coupling coefficient ($k_m \approx 1$) may be achieved between the (center) primary and secondary windings in the type I design (first embodiment) and the primary and secondary windings in the type II design (second embodiment). The self-rolled-up microtube transformer designs can yield a dramatic reduction (over 12 times) in footprint and significant performance improvement, including a high turn ratio n with a high coupling coefficient $k_m$ (type I) or $k_m \approx 1$ (type II), high primary and secondary inductance area density, wide working frequency band, high area density of the product of n and $k_m$, and extremely low leakage inductance (type II).

Figure 6:
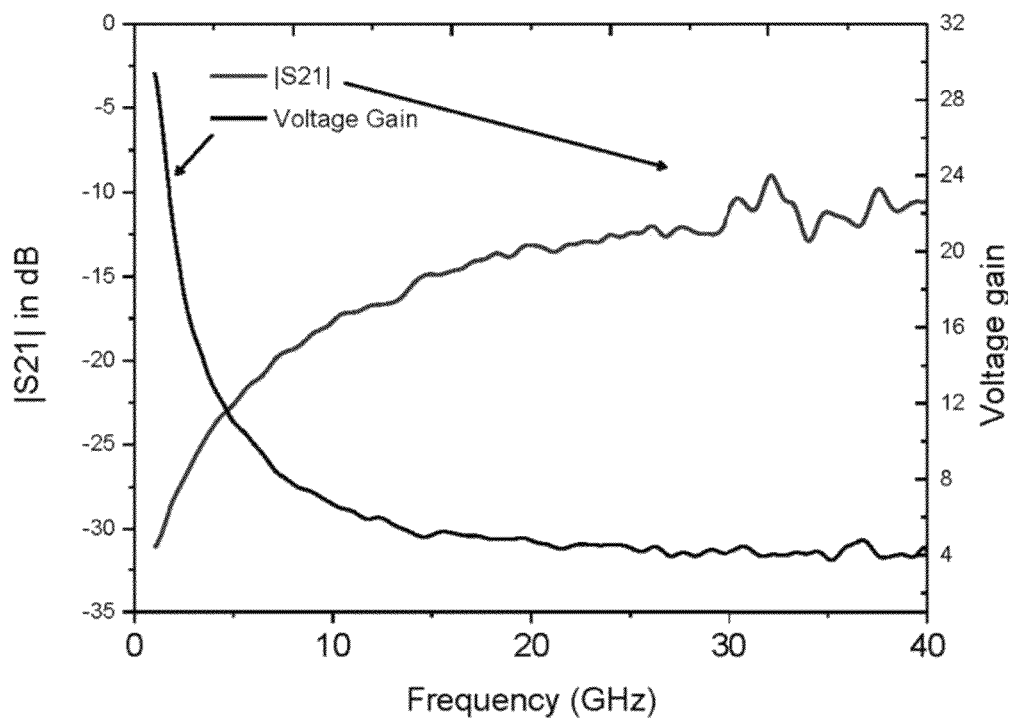
FIG. 6 is a plot of voltage gain and |S21| vs. frequency for exemplary rolled-up transformer samples A and B.

To better illustrate the function of the rolled-up transformer to transform voltage, a voltage gain $G_v$ may be defined as the ratio of the induced voltage in the primary winding ($V_p$) to the secondary voltage ($V_s$). The frequency response of $G_v$ can be discussed in three different frequency bands—low frequency band, middle frequency band and high frequency band. FIG. 6 shows a measured curve between $G_v$ and frequency of an exemplary type I transformer sample ("A") from 1 GHz to 40 GHz. The planar dimensions of exemplary samples A and B are shown in Table I. Any of the provided dimensions for these exemplary structures may be varied within ±100%, ±70%, ±50%, ±30%, ±20%, or ±10% in forming other transformer structures having suitable planar dimensions.

In this particular example, the low frequency band is from 1 GHz to 15 GHz. In this frequency band, signals may go to ground through the mutual induction until the working frequency is high enough to prevent ground shorting. By increasing the coupling coefficient and/or the inductances of the primary and secondary windings, it may be possible to achieve a larger mutual inductance and the frequency may be narrowed to lower frequency band. The middle frequency band shows a steady $G_v$; the loss apparent in |S21| is due to the primary and secondary leakage inductances and ohmic losses. It sample A were tested to a higher frequency, |S21| would resonant at a certain frequency point due to overlap capacitance between the primary and secondary windings. Reducing the overlap capacitance and/or the primary and secondary leakage inductances can push the resonant frequency point up to higher frequency band, which could widen the working frequency band of the tube transformer.

TABLE I

Planar dimensions of exemplary transformer samples A and B

| Sample # | $l_{sp}$ (μm) | $l_{ss}$ (μm) | $g_v$ (μm) | $g_l$ (μm) | $w_{sp}$ (μm) | $w_{ss}$ (μm) |
|---|---|---|---|---|---|---|
| A | 86 | 30 | 80 | 5 | 15 | 15 |
| B | 86 | 30 | 60 | 5 | 15 | 15 |

| Sample # | $l_{cp}$ (μm) | $l_{ss}$ (μm) | $w_{cp}$ (μm) | $w_{cs}$ (μm) | $w_{tp}$ (μm) |
|---|---|---|---|---|---|
| A | 15 | 15 | 5 | 5 | 5 |
| B | 15 | 15 | 5 | 5 | 5 |

In order to obtain a good performance of the rolled-up transformer (type I or type II), it is advantageous to reduce (a) the resistivity of the conductive strips to lower the ohmic loss, (b) the overlap capacitance to make the working frequency band wider, and (c) the leakage inductance to lower the return loss and also increase the width of the working frequency band.

Figure 7:
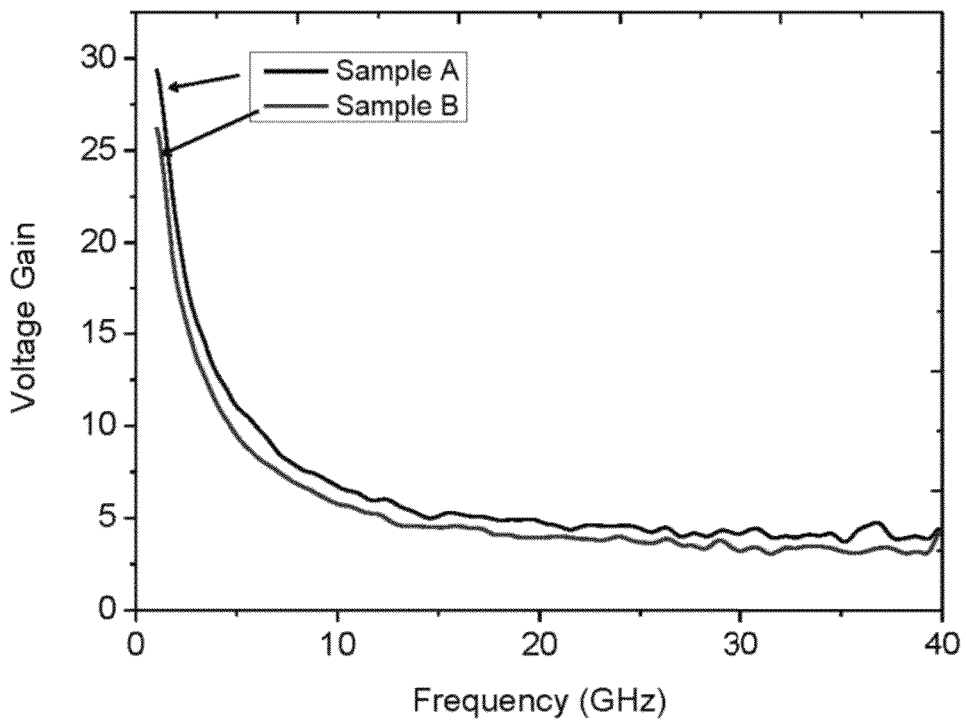
FIG. 7 is a plot of voltage gain vs. frequency for exemplary rolled-up transformer samples A and B.

For type I rolled-up transformers, the side effects of the feed windings and inevitable parasitic parameters, especially the coupling capacitance ($C_{ps}$) between the center primary and secondary windings, may make the voltage gain $G_v$ depend on frequency. The coupling capacitance $C_{ps}$ together with the leakage inductances from the primary ($L_{leakage\_p}$) and secondary ($L_{leakage\_s}$) windings can make the transformer self-resonate at a certain frequency, which, at the same time, may lower the voltage transform coefficient continually from low frequency to its resonance frequency. Therefore, the vertical gap distance $g_v$ between the primary and secondary winding strips may advantageously be designed as large as possible to reduce the coupling capacitance $C_{ps}$. However, longer conductive feed strips are needed when there is a large vertical gap distance $g_v$, which can enhance the negative side effect of the feed windings due to an increased number of turns. Thus, a compromise in the design is beneficial. As shown in FIG. 7, the type I rolled-up transformer sample B has a smaller gap distance $g_v$ (see dimensions provided in Table I), and thus its resonance frequency is smaller than that of sample A, which can be seen from the quicker drop of voltage gain $G_v$.

Table II summarizes the performance parameters of sample A and compares the parameters with those of the best on-chip planar transformer with same turn ratio n reported so far. The area density of the product of n and k of the tube transformer is more than about 6 times larger than that of the planar transformer, but with a footprint that is about 8 times smaller.

With the design of the type II microtube transformer, the expected coupling coefficient is very close to the ideal value of 1, and the feed windings are not used (and thus their negative effects are avoided). Low permittivity $SiO_2$ may be used as the intermediate layer to reduce the overlap inductance between the primary and secondary windings. Although the overlap capacitance may still be larger than that of the type I design, due to the extremely small leakage inductances, a high resonance frequency may be achieved. The overall performance of the type II rolled-up transformer is expected to be even better than that achieved by the type I rolled-up transformer.

TABLE II

Performance comparison between tube transformer sample A and the best known planar transformer

| Devices | $L_p$ (nH) | $L_s$ (nH) | Chip Area ($\mu m^2$) | $L_p$/Area (nH/mm$^2$) | $L_s$/Area (nH/mm$^2$) |
|---|---|---|---|---|---|
| Sample A | 0.8 | 0.15 | 1200 | 666.7 | 125 |
| Planar[1] | 10.52 | 0.34 | 10000 | 1052 | 34 |

| Devices | M (nH) | k | n | N = n · k | n · k/Area (1/mm$^2$) |
|---|---|---|---|---|---|
| Sample A | 0.2 | 0.58 | 4.78 | 2.77 | 2308.3 |
| Planar[1] | 1.31 | 0.7 | 5.59 | 3.91 | 391 |

[1]H-M. Hsu, et al. "Design of Coil Length of On-Chip Transformer With High Turn Ratio and High Coupling Performance," *IEEE Transactions on Electron Devices*, Vol. 59, No. 11, November, 2012.

Fabrication Method

A method of making a rolled-up transformer structure for a radiofrequency integrated circuit includes forming a sacrificial layer on a substrate and forming a strained layer on the sacrificial layer, where the strained layer typically comprises an upper portion under tensile stress and a lower portion under compressive stress. The strained layer is held on the substrate by the sacrificial layer. At least one conductive pattern layer is formed on the strained layer. The conductive pattern layer(s) may include a first conductive film separated from a second conductive film in a thickness direction (second embodiment) and/or in a rolling direction (first embodiment). The first conductive film comprises an even number of primary conductive strips, where each primary conductive strip has a length extending in the rolling direction, and the second conductive film comprising an even number of secondary conductive strips, where each secondary conductive strip has a length extending in the rolling direction. Removal of the sacrificial layer from the substrate is initiated, thereby releasing an end of the strained layer, and removal of the sacrificial layer is continued, thereby allowing the strained layer to move away from the substrate and roll up to relieve strain in the strained layer. The conductive pattern layer(s) adhere to the strained layer during the roll-up and a rolled-up transformer structure is formed, where, after the roll-up, turns of the secondary conductive strips and turns of the primary conductive strips wrap around the longitudinal axis, as described above. The primary conductive strips serve as a primary winding and the secondary conductive strips serve as a secondary winding of the rolled-up transformer structure.

Forming the strained layer may entail depositing two sublayers that have different lattice parameters. Forming the strained layer may also or alternatively entail depositing two sublayers having different stoichiometries. A deposition method known in the art, such as physical vapor deposition or chemical vapor deposition, may be employed to form the strained layer and/or the sacrificial layer. The sacrificial layer may be removed by wet or dry etching with an appropriate etchant. The sacrificial layer may comprise a metal such as Ge that may be preferentially etched without etching the overlying strained layer or the underlying substrate material.

The conductive pattern layer(s) may be formed by depositing a metal thin film on the strained layer by a vapor deposition method such as sputtering or evaporation, and then patterning the metal thin film using lithography and etching steps known in the art to create a metal pattern, thereby forming the conductive pattern layer. The conductive pattern layer(s) may include at least one conductive feed line connected to the sacrificial layer and/or at least one conductive feed line connected to the substrate.

An exemplary fabrication method is described below in reference to FIGS. 8A-8G for an arbitrary conductive pattern layer geometry. Deposition of an isolation layer 850 on a silicon wafer 855 is shown schematically in FIG. 8A. The isolation layer 850 may be a thick film having a thickness of from about 0.5-2 microns and may comprise an oxide (e.g., $SiO_2$). Prior to deposition of the isolation layer 850, the surface of the silicon wafer 855 may be cleaned to remove oils, organic residues and/or oxides. The isolation layer 850 is typically formed on the silicon wafer 855 using plasma enhanced chemical vapor deposition (PECVD).

Figure 8A:
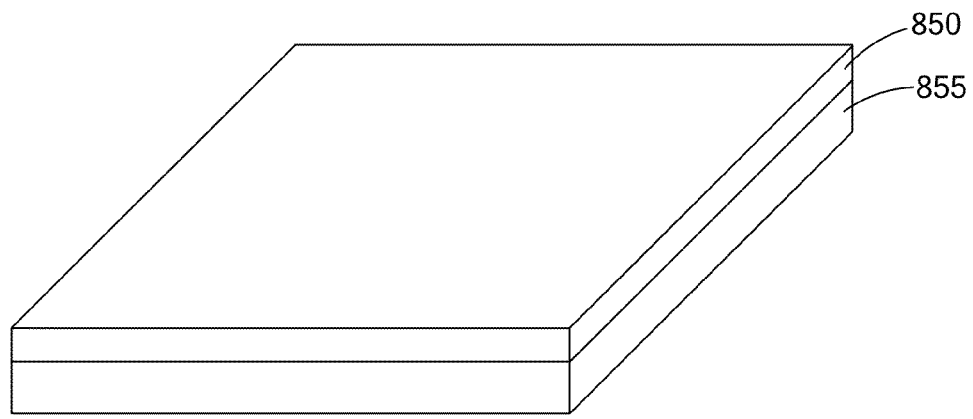
FIGS. 8A-8F show exemplary processing steps to form a rolled-up device structure.
Figure 8B:
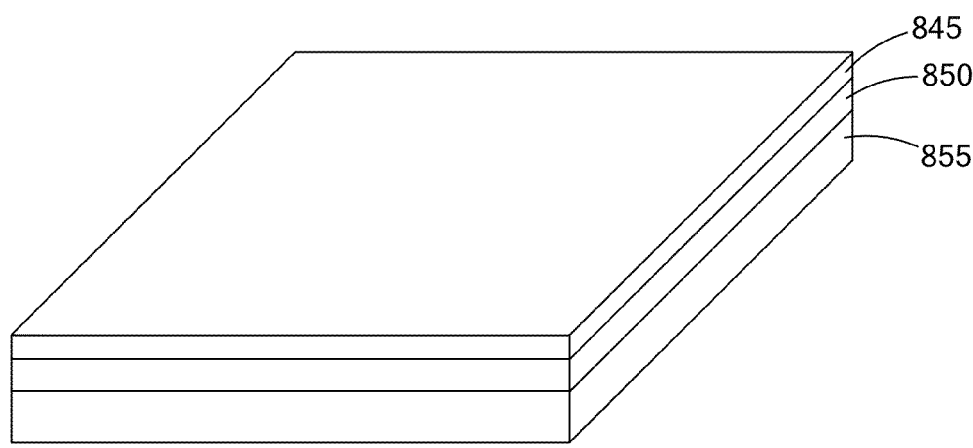

Next, the sacrificial layer 845 may be formed on the isolation layer 850, as shown schematically in FIG. 8B. A vapor deposition method such as electron beam evaporation or sputtering may be used. In this example, the sacrificial layer 845 comprises germanium deposited to a thickness of about 20 nm in thickness, although the thickness of the sacrificial layer 845 may more generally range from about 5 nm to about 50 nm, and other selectively etchable materials may be used.

Figure 8C:
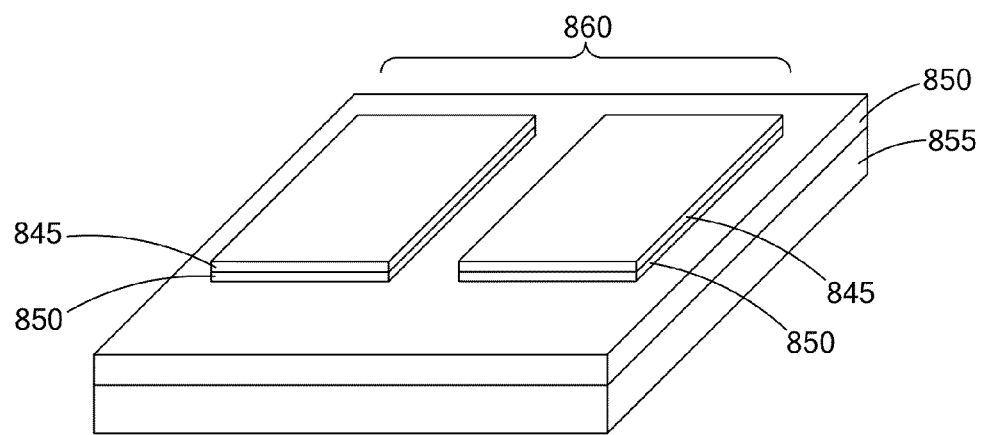

Optical lithography is used to define the desired substrate or stage pattern 860 followed by Freon reactive ion etching (RIE), or another suitable etching method, to remove unwanted portions of the sacrificial layer 845 and etch a considerable depth into the isolation layer 850, as illustrated in FIG. 8C.

Figure 8D:
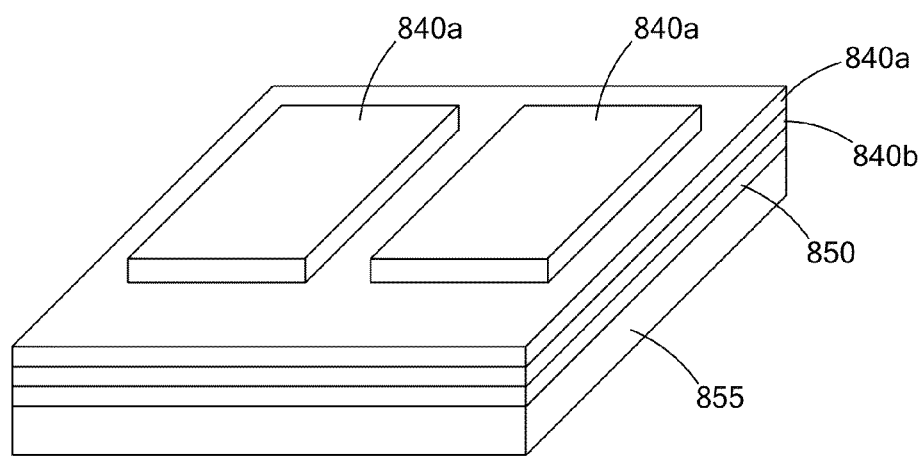
Figure 8E:
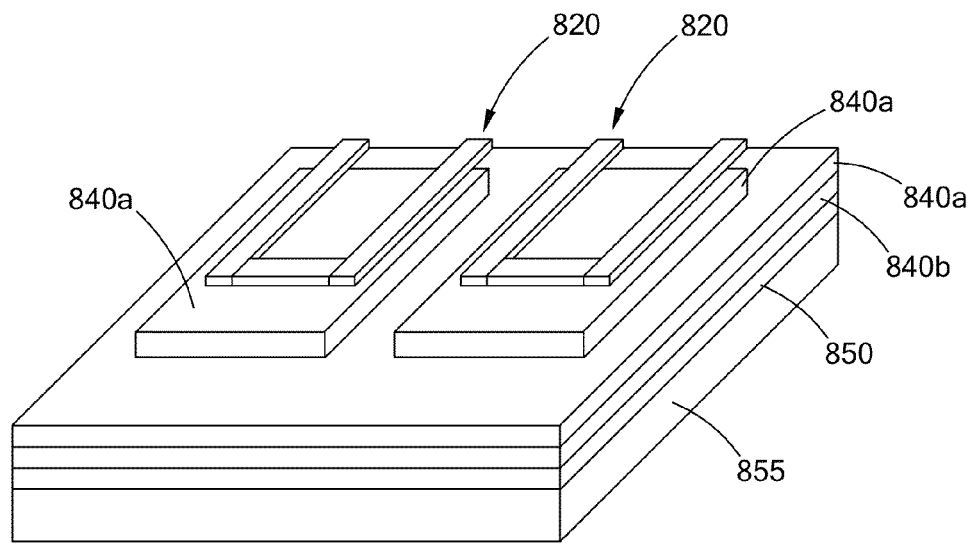

Referring to FIG. 8D, the next step is strained layer deposition, where low and high frequency PECVD are employed in sequence to deposit oppositely strained $SiN_x$ layers 840b, 840a. As shown in FIG. 8E, conductive strips (or generally speaking, the conductive pattern layer 820) may be formed by optical lithography followed by electron beam evaporation to deposit a nickel thin film of about 5 nm in thickness and a gold film of about 60 nm or more in thickness, followed by lift-off technology to remove unwanted portions of the metal layer.

Figure 8F:
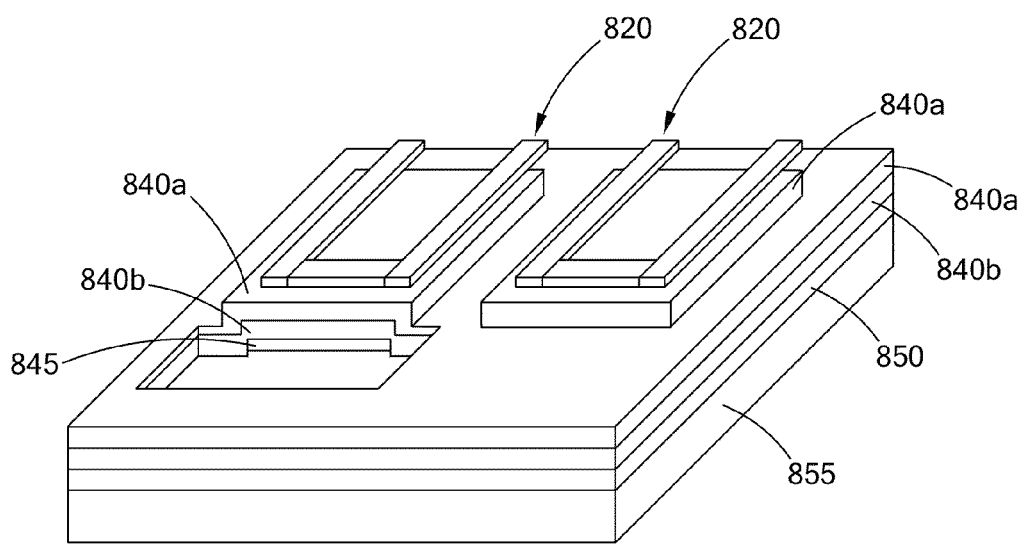

Optical lithography is employed for a third time to define window patterns, followed by Freon RIE to etch away the unwanted portions of the layers defined by the window patterns, thereby forming openings in the layers that allow access to the underlying sacrificial layer 845, as shown schematically in FIG. 8F. Finally, an appropriate etchant may be used to etch the sacrificial layer 845 and enable the strained layers 840a, 840b to be released and to roll up, as shown schematically in FIGS. 1C and 1D. For example, in the case of a Ge sacrificial layer 845, the wet etching may be carried out using 50 ml 30% hydrogen peroxide with 2 ml citric acid as the etchant at 90° C.

Figure 8G:
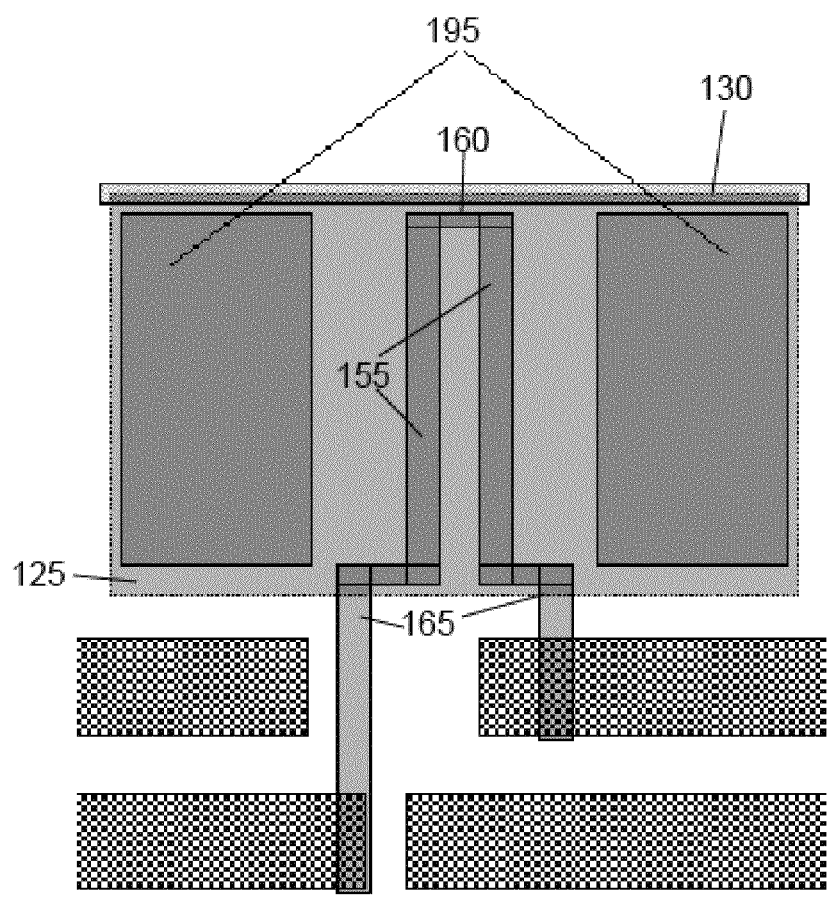
FIG. 8G illustrates the use of side support strips in fabrication.

FIG. 8G shows a top view of an exemplary conductive pattern layer comprising inductor cells 155 on a strained layer 125 prior to rolling, in which support film strips 195 are positioned outside the inductor cells 155 on the strained layer 125 to facilitate an even rolling process. This may be particularly advantageous when the length of the conductive strips 155 is long and the rolled configuration 110 includes a large number of turns. The support film strips 195 are typically located at least 50 microns away from the nearest inductor cells 155 and have no connection to the inductor cells 155. The support film strips 195 may be formed as part of the metal pattern layer and may have the same thickness as the conductive strips 155.

An exemplary transfer printing process uses a patterned polymeric (typically PDMS) stamp to selectively pick up nanostructures (in this case, rolled-up transformer structures) from their native substrates and deposit them in a desired layout onto functional substrates, without the use of adhesives. Such a process is described in U.S. Patent Application Publication 2013/0036928 (J. A. Rogers, P. Ferreira, and R. Saeidpourazar), entitled "Non-Contact Transfer Printing," which is hereby incorporated by reference. High density packing of rolled-up transformer structures and/or other rolled-up devices for a RFIC can be achieved using transfer printing. The technology has already been demonstrated at a commercial scale for solar cells (Semprius, Inc., Durham, N.C.).

Diverse applications for rolled-up device structures have been proposed theoretically and some have been demonstrated experimentally, including III-V quantum dot microtube lasers, metamaterials based on arrays of gold/GaAs tubes, optical tube resonators integrated with silicon on insulator (SoI) waveguides, and biological sensors using microtube resonators. Recently, a metal (Ti/Cr)/insulator ($Al_2O_3$)/metal (Ti/Cr) tube capacitor structure has been demonstrated experimentally for ultracompact energy storage. These tube capacitors are almost two orders of magnitude smaller than their planar counterparts. In the present disclosure, a novel design platform has been described for on-chip transformers based on strain-induced self-rolled-up nanotechnology, which produces 3D architectures through simple planar processing.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. A rolled-up transformer structure for a radiofrequency integrated circuit (RFIC), the rolled-up transformer structure comprising:

a multilayer sheet having a rolled configuration comprising multiple turns about a longitudinal axis, the multilayer sheet comprising more than one conductive pattern layer on a strain-relieved layer, the more than one conductive pattern layer comprising a first conductive film separated from a second conductive film in a thickness direction, wherein the first conductive film comprises an even number of primary conductive strips, each primary conductive strip having a length extending in the rolling direction, wherein the second conductive film comprises an even number of secondary conductive strips, each secondary conductive strip having a length extending in the rolling direction, wherein, in the rolled configuration, turns of the secondary conductive strips and turns of the primary conductive strips wrap around the longitudinal axis, the primary conductive strips being a primary winding and the secondary conductive strips being a secondary winding of the rolled-up transformer structure.

2. The rolled-up transformer structure of claim 1, wherein the second conductive film is disposed above the first conductive film on the strained layer.

3. The rolled-up transformer structure of claim 1, wherein the first conductive film is disposed above the second conductive film on the strained layer.

4. The rolled-up transformer structure of claim 1, wherein an intermediate layer is disposed between the first conductive film and the second conductive film on the strain relieved layer.

5. The rolled-up transformer structure of claim 1, wherein the primary conductive strips overlap with the secondary conductive strips in the rolled configuration.

6. The rolled-up transformer structure of claim 1, wherein the rolled configuration of the multilayer sheet comprises at least about 30 turns.

7. A device comprising:
a plurality of the rolled-up transformer structures of claim 1 on a substrate.

* * * * *